US008766832B1

(12) United States Patent
Bogue (10) Patent No.: US 8,766,832 B1
(45) Date of Patent: Jul. 1, 2014

(54) BACKGROUND CALIBRATION SCHEME FOR ANALOG-TO-DIGITAL CONVERTERS

(71) Applicant: Xilinx, Inc., San Jose, CA (US)

(72) Inventor: Ivan Bogue, Cork (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/669,033

(22) Filed: Nov. 5, 2012

(51) Int. Cl.
*H03M 1/10* (2006.01)
*H03M 1/12* (2006.01)

(52) U.S. Cl.
CPC . *H03M 1/10* (2013.01); *H03M 1/12* (2013.01)
USPC .......................................... 341/120; 341/155

(58) Field of Classification Search
CPC .................................. H03M 1/10; H03M 1/12
USPC ........................ 341/155, 120, 159, 118, 131
See application file for complete search history.

(56) References Cited

U.S. PATENT DOCUMENTS

| | | | | |
|---|---|---|---|---|
| 6,404,364 B1 * | 6/2002 | Fetterman et al. | ............ | 341/131 |
| 7,535,391 B1 * | 5/2009 | Newman et al. | ............. | 341/131 |
| 7,598,896 B2 * | 10/2009 | Kawahito | ...................... | 341/162 |
| 8,378,869 B2 * | 2/2013 | Chae et al. | .................... | 341/143 |

OTHER PUBLICATIONS

Elbornsson, J. et al., "Blind adaptive equalization of mismatch errors in a time interleaved A/D converter system," IEEE Trans. Circuits Syst. I. Reg. Papers, vol. 51, No. 1, Jan. 2004, 13 pgs.
Jamal, S.K. et al., "A 10-bit 120MSample/s time-interleaved analog-to-digital converter with digital background calibration," IEEE J. Solid-State Circuits, vol. 37, No. 12, Dec. 2002, pp. 1618-1627.
Lee, Z.M. et al., "A CMOS 15-bit 125MS/s time-interleaved ADC with digital background calibration," IEEE J. Solid-State Circuits, vol. 42, No. 10, Oct. 2007, pp. 2149-2160.

* cited by examiner

*Primary Examiner* — Brian Young
(74) *Attorney, Agent, or Firm* — Kevin T. Cuenot (57) ABSTRACT

An analog-to-digital converter (ADC) includes an analog input stage including an output configured to generate an analog output signal and a digital stage coupled the output of the analog input stage. The digital stage is configured to classify the analog output signal into one of a plurality of consecutive voltage ranges. Responsive to the analog output signal being classified in a first enumerated voltage range of the plurality of voltage ranges during a rotation of a sample, a voltage for a subsequent rotation is determined as if the analog output signal is classified into a non-enumerated voltage range selected according to a state of a random number signal.

18 Claims, 5 Drawing Sheets

BACKGROUND CALIBRATION SCHEME FOR ANALOG-TO-DIGITAL CONVERTERS

FIELD OF THE INVENTION

One or more embodiments disclosed within this specification relate to analog-to-digital converters and, more particularly, to calibrating analog-to-digital converters.

BACKGROUND

An analog-to-digital converter (ADC) includes one or more analog stages and one or more digital stages. The analog stage is configured to provide a fixed amount of gain to received analog signals to be converted to digital form. The digital stage, using the known gain of the analog stage, compares the analog signals with known reference voltages, decodes the results, and generates output samples.

Any variation in the amount of gain that is provided by the analog stage can result in errors and/or non-linearity in the samples that are output from the digital stage of the ADC. Unfortunately, gain in the analog stage can vary for a variety of different reasons including temperature, process variations inherent in integrated circuit manufacturing processes, less than ideal performance of electronic components such as amplifiers, and the like.

In some cases, to accommodate for variations in the gain of the analog stage of the ADC, the ADC is taken offline (rendered inoperable) for periods of time during which calibration is performed. The ADC is unusable for the entire time in which calibration is performed. In other cases, changes to the signal path of the ADC, e.g., changes to the capacitive elements in the signal path, are introduced to compensate for gain variation. The changes, however, may not be desirable in terms of overall performance of the ADC.

SUMMARY

An analog-to-digital converter (ADC) includes an analog input stage having an output configured to generate an analog output signal and a digital stage coupled to the output of the analog input stage that is configured to classify the analog output signal into one of a plurality of consecutive voltage ranges. Responsive to the analog output signal being classified within a first enumerated range of the plurality of voltage ranges during a rotation of a sample, a voltage for a subsequent rotation of the sample is determined as if the analog output signal is classified into a non-enumerated voltage range selected according to a state of a random number signal.

An ADC includes an analog input stage having an output configured to generate an analog output signal and a digital stage coupled the output of the analog input stage. The digital stage includes a comparator stage having at least four comparators configured to receive the analog output signal, a random number generator configured to generate a random number signal, and a digital block configured to receive an output from each comparator and generate a classification assigning the analog output signal into one of a plurality of consecutive voltage ranges. The digital stage further includes a decoder coupled to the digital block and random number generator that is configured to receive the classification and the random number signal. Responsive to the analog output signal being classified within a first enumerated voltage range of the plurality of voltage ranges during a rotation of a sample, the decoder is configured to determine a voltage provided to a subsequent rotation as if the analog output signal is classified into a non-enumerated voltage range selected according to a state of the random number signal.

A method calibrating an ADC includes classifying an analog output signal of an analog input stage of the ADC into one of a plurality of consecutive voltage ranges and, responsive to the analog output signal being classified within a first enumerated range of the plurality of voltage ranges during a rotation of a sample, determining a voltage for a subsequent rotation as if the analog output signal is classified into a non-enumerated voltage range selected according to a state of a random number signal. The method further includes generating samples and calculating a gain of the analog input stage according to a first average of samples in which the analog output signal is classified in the first enumerated voltage range and the random number signal is in a first state for a rotation and a second average of samples in which the analog output signal is classified in the first enumerated range and the random number signal is in a second state for a rotation.

DETAILED DESCRIPTION OF THE DRAWINGS

While the specification concludes with claims defining novel features, it is believed that the features disclosed within this specification will be better understood from a consideration of the description in conjunction with the drawings. The process(es), machine(s), manufacture(s) and variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to analog-to-digital converters (ADCs) and, more particularly, to calibration of ADCs. In accordance with the inventive arrangements disclosed within this specification, an ADC can be calibrated using a background process that allows the ADC to continue to operate. The ADC can be calibrated without taking the ADC "offline" or otherwise rendering the ADC inoperable and unavailable for use during the calibration process.

The digital stage of the ADC can be modified, in part, through the inclusion of additional comparators that facilitate background calibration. The added comparators, in combination with other features, allow the digital stage to measure the gain of the analog stage of the ADC during operation. The actual gain of the analog stage, as measured by the digital stage during operation of the ADC and without taking the ADC offline, can then be used in generating output samples from received analog input signals.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
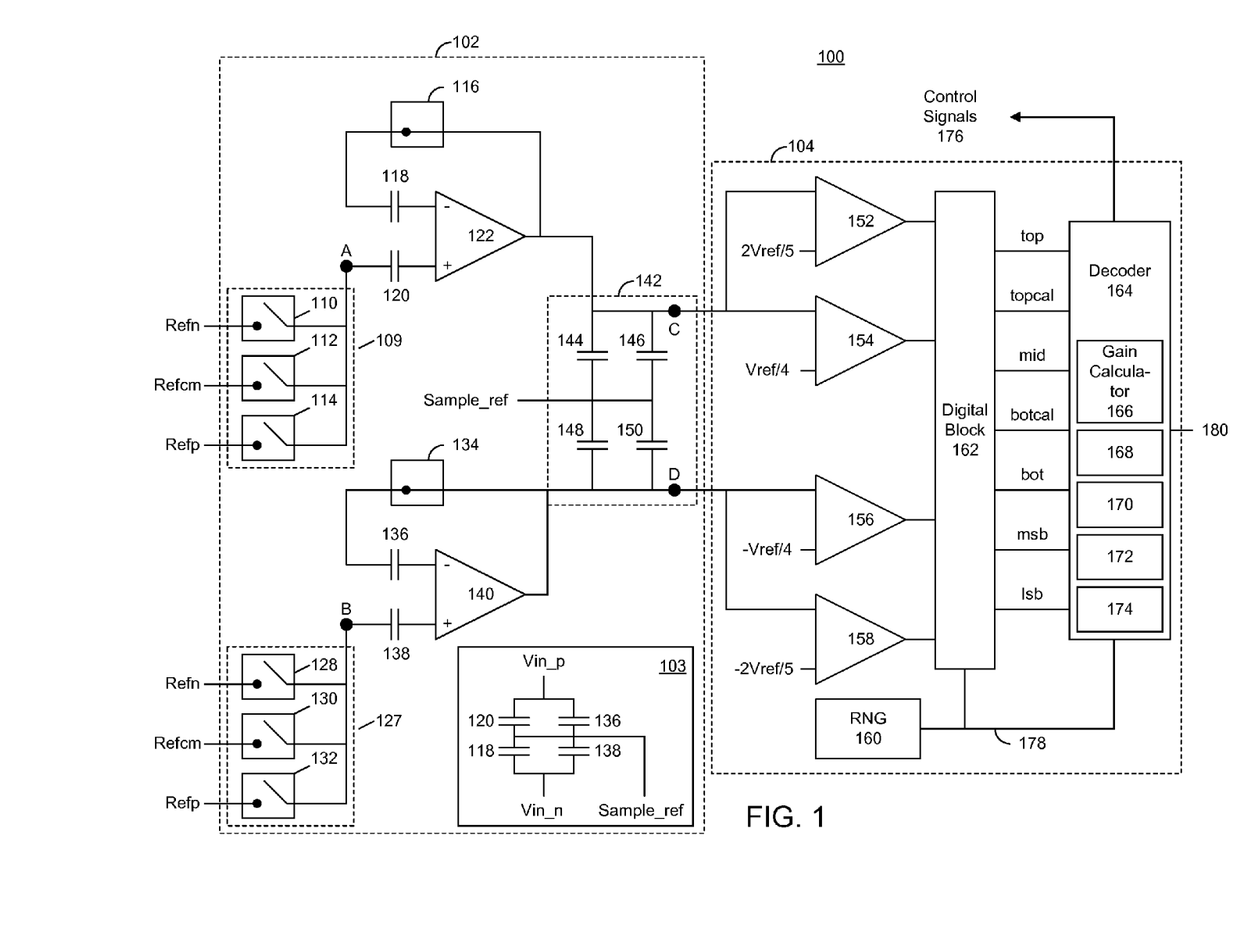
FIG. 1 is a block diagram illustrating an exemplary analog-to-digital (ADC) circuit.

FIG. 1 is a block diagram illustrating an exemplary ADC circuit (hereafter "ADC") 100. ADC 100 is configured to perform background calibration. "Background calibration" refers to a calibration process that is performed while ADC 100 operates. In particular, ADC 100 continues to receive analog input signals and generates samples for the analog input signals while the background calibration process operates. By comparison, other techniques for calibration of an ADC are not background processes as the ADC must be taken offline in order to perform calibration. More particularly, the ADC stops sampling analog input signals and stops generating digital samples in order for calibration to take place. While stopped, the ADC is calibrated. Only after calibration is complete, is the ADC started or put back "online."

ADC 100 is a 1.5 bit ADC that can be used to implement an algorithmic ADC or a pipeline ADC. Within an algorithmic ADC, the circuit structure utilizes the circuitry illustrated in FIG. 1 a number of times (e.g., rotations) to generate an "N" bit sample as the output, wherein N is an integer value. It should be appreciated that the circuitry illustrated in FIG. 1 also can be included as part of a pipeline ADC, for example, where the analog input stage is pipelined (e.g., replicated), with the output of each stage serving as the input to the next stage.

ADC 100 includes an analog input stage 102 and a digital stage 104. Analog input stage 102 includes a first channel including amplifier 122. Amplifier 122 has a differential input in which capacitor 118 is connected to a negative input terminal of amplifier 122 and capacitor 120 is coupled to a positive input terminal of amplifier 122. Switches 110, 112, and 114, collectively referred to as reference block 109, control which of reference voltages "Refn," "Refcm," or "Refp" is connected to capacitor 120 (node A) and the positive input terminal of amplifier 122. Switch 116 controls whether the output terminal of amplifier 122 is coupled to capacitor 118 and the negative input terminal of amplifier 122 forming a feedback loop.

A "switch" refers to any device that makes and breaks a connection in an electric circuit. A switch can be implemented using any of a variety of known circuit components. In one aspect, a switch is implemented as a transistor that opens and closes responsive to a control signal, e.g., a control signal provided to the gate of the transistor. Other more complex switches can be utilized, e.g., multi-transistor switches, that are configured to open and to close responsive to a control signal. When a switch is "closed," the switch forms a conductive path between two nodes of a circuit that are physically connected to the switch. A closed switch is, in effect, a short circuit. When a switch is "open," the switch disconnects two nodes of the circuit physically connected to the switch from one another thereby creating an open circuit, e.g., no conductive path, between the two nodes.

Analog input stage 102 also includes a second channel including amplifier 140. Amplifier 140 has a differential input in which capacitor 136 is connected to a negative input terminal of amplifier 140 and capacitor 138 is coupled to a positive input terminal of amplifier 140. Switches 128, 130, and 132, collectively referred to as reference block 127, control which of reference voltages "Refn," "Refcm," or "Refp" is connected to capacitor 138 (node B) and the positive input terminal of amplifier 140. Switch 134 controls whether the output terminal of amplifier 140 is coupled to capacitor 136 and the negative input terminal of amplifier 140 forming a feedback loop.

It should be appreciated that each of switches 110-116 and 128-134 is controlled by one of control signals 176. The state of the particular control signal provided to each switch dictates whether the corresponding switch is open or closed. Control signals 176 provided to each of switches 110-114 and 128-132 are derived from signals output from digital block 162 within digital stage 104 to be described in further detail within this specification.

One or more additional switches (not shown) also are included in order to form an input block as illustrated in block 103. Block 103 illustrates analog input stage 102 receiving Vin, which is a differential signal having component signals Vin_p and Vin_n. Prior to beginning a first rotation, e.g., during a sample phase, switches within ADC 100 are configured, e.g., opened or closed, in order to couple Vin to analog input stage 102 as shown in block 103. As such, Vin_n and Vin_p are sampled onto capacitors 120, 136, 118, and 138. At that point, switches 110-116 and 128-134 are opened.

Subsequently, e.g., during a hold phase of ADC 100, switches 116 and 134 are closed. Vin is disconnected from capacitors 118, 120, 136, and 136. Also during the hold phase, one of switches 110-114 is closed and one of switches 128-132 is closed to couple a selected reference voltage to capacitor 120 and capacitor 138, respectively. Reference voltages "Refp," "Refcm," and "Refn" are referred to as the positive, the common mode, and the negative reference voltages respectively. Using switches 110-114 and switches 128-132, nodes A and B provide a differential signal that is either a positive reference voltage (Refp−Refn), a zero (0) volt output (Refcm−Refcm), or a negative reference voltage reference (Refn−Refp).

In one sample phase, Vin_p is sampled on capacitor 118 and the positive input terminal of amplifier 122 in the first channel and Vin_n is sampled on capacitor 136 and the positive input terminal of amplifier 140 in the second channel. In a next sample phase, Vin_p is sampled on capacitor 120 and the positive input terminal of amplifier 122 in the first channel and Vin_n is sampled on capacitor 138 and the positive input terminal of amplifier 140 of the second channel.

Analog input stage 102 further includes an output section 142. Capacitors 144 and 146 are connected in parallel from node C to a reference voltage denoted as "sample_ref." Capacitors 148 and 150 are connected in parallel from node D to sample_ref. Nodes C and D define the location in ADC 100 from which the signals (analog signals) output from analog stage 102 are taken and provided to digital stage 104.

For purposes of illustration, a capacitor set A is defined that includes capacitors 118, 120, 136, and 138. A capacitor set B is defined that includes capacitors 114, 146, 148, and 150. The capacitor sets effectively switch positions in terms of functionality. During a first rotation, for example, capacitor set A is around the input to amplifiers 122 and 140, while capacitor set B is at the output of amplifiers 122 and 144. During a next rotation, capacitor set A is at the output of amplifiers 122 and 144, while capacitor set B is at the input of amplifiers 122 and 144. Capacitor sets A and B continue to switch positions, or switch, for each subsequent rotation through the use of additional switches not illustrated, but known to one skilled in the art. Thus, the following capacitor pairs can be viewed as equivalent capacitors 144 and 120; 146 and 136; 148 and 118; and 150 and 138.

Digital stage 104 includes a comparator stage including comparators 152, 154, 156, and 158, a random number generator (RNG) 160, a digital block 162, and a decoder 164. Each of comparators 152-158 receives a variation of a common reference voltage called "Vref" at an input terminal. As shown, comparator 152 receives 2Vref/5 as a reference voltage at a first input terminal and is connected to node C at a second input terminal. Comparator 154 receives Vref/4 at a first input terminal and is connected to node C at a second input terminal. Comparator 156 is coupled to −Vref/4 at a first input terminal and is connected to node D at a second input terminal. Comparator 158 is connected to −2Vref/5 at a first input terminal and is connected to node D at a second input terminal.

Vref represents an ideal signal to which the input to the ADC (e.g., Vin) is compared. If Vref=1 v and Vin=1 v, then the output from the ADC is full scale. As such, Vref=Refp−Refn and Refcm=(Refp−Refn)/2. Sample_ref is typically set to approximately the same value as Refcm. Sample_ref further can be set equal to Refcm. In general, while there is no loss in performance when Refcm=Sample_ref, in some cases, to reduce loading a node too much, sample_ref and Refcm are obtained from two different places or sources. As such, it is possible for sample_ref and Refcm to differ slightly.

Each of comparators 152-158 compares the received signals and outputs a value indicating whether the signal received from node C or node D, as the case may be, is larger than the reference voltage. The output from each of comparators 152-158 is connected to digital block 162, which interprets the output from each of comparators 152-158 and classifies the analog input signal (e.g., the signal from each of nodes A and B) into one of a plurality of different and consecutive voltage ranges.

Digital stage 104 classifies signals into one of five different and consecutive voltage ranges. The voltage ranges are (1) 2Vref/5 and above; (2) below 2Vref/5 and at or above Vref/4; (3) less than Vref/4 and at or above −Vref/4; (4) less than −Vref/4 and at or above −2Vref/5; and (5) below −2Vref/5. Within this specification, the voltage ranges are referred to as (1) top; (2) topcal; (3) mid; (4) botcal; and (5) bot. As shown, digital block 162 outputs signals corresponding to "top," "topcal," "mid," "botcal," and "bot." In the example pictured in FIG. 1, each of signals top, topcal, mid, botcal, and bot are one bit signals and only one of the signals is high (i.e., a "1") at a time. Digital block 162 also outputs a most significant bit (msb) signal and a least significant bit (lsb) signal. The msb is 1, 0, 0 in top, mid, and bot respectively. The lsb is 0, 1, 0 in top mid, and bot respectively. It should be appreciated that the particular values illustrated, e.g., 2Vref/5, Vref/4, −Vref/4, and −2Vref/5 are provided for purposes of illustration and, as such, are not intended as limitations. Other values can be used so long as five continuous voltage ranges are specified or formed.

RNG 160 is configured to generate a random signal 178. Random signal 178 is implemented as a bitstream, e.g., a stream of random zeros and ones. As shown, random signal 178 is provided to digital block 162 and to decoder 164. In one example, random signal 178 takes on a value of one or zero randomly at least for each first rotation of a sample that is generated and output from ADC output 180. In another example, random signal 178 takes on a value of one or zero randomly for each rotation.

Decoder 164 receives the top, topcal, mid, botcal, bot, msb, and lsb signals from digital block 162. In addition, as noted, decoder 164 receives random signal 178. Decoder 164 decodes the received signals and generates samples at ADC output 180. As noted, ADC 100 can implement an algorithmic type of ADC in which Vin is input from a source external to ADC 100 and used during a first rotation. For the subsequent rotations, the voltage that is input to analog input stage 102 as Vin is taken from nodes C and D. The necessary switches responsible for providing signals from nodes C and D as Vin to analog input stage 102 for rotations of a sample calculation following the first rotation are not illustrated for purposes of clarity, but are known to those skilled in the art.

In another aspect, ADC can be part of a pipelined type of ADC. In that case, analog input stage 102 can be duplicated to form additional stages in which each additional stage is responsible for performing a rotation of a sample calculation. Vin for the first analog input stage is obtained from a source external to the ADC. Each analog input stage following the first analog input stage receives Vin as the output (e.g., nodes C and D) from the prior analog input stage in the pipeline.

In general, the ideal gain of analog input stage 102 is two. Analog input stage 102 provides an ideal gain of two and adds the output of reference blocks 109 and 127, and drives the resulting output signal onto output 142 (i.e., capacitors 144-150). Output 142 is quantized by comparators 152-158. Digital block 162 classifies, or determines, which of five different voltage ranges within which the voltage taken at nodes C and D is located.

When the gain of analog input stage 102 varies from the ideal gain of two, errors are introduced into ADC output 180. If the gain of analog input stage 102 varies from the idealized value, digital stage 104 can compensate for the variation presuming the variation is known. A background calibration process as described within this specification can be used to determine the actual gain of analog input stage 102. The actual gain, as determined using the background calibration process, can be incorporated into the decoding process performed by decoder 164, thereby allowing ADC 100 to generate accurate sample values from ADC output 180.

Referring to ADCs in general, a "rotation" describes the processing performed in a particular stage to obtain a portion of the resulting sample value, e.g., 1 bit of an N bit sample. In the case of an algorithmic ADC, e.g., ADC 100, each rotation determines 1 bit of an N bit sample. Thus, for a 15 bit ADC, each rotation determines 1 bit of the resulting 15 bit sample. ADC 100 requires 15 rotations to generate the resulting 15 bit sample. The output at nodes C and D is fed back into the input of analog stage 102 as Vin for rotations 2-15 in order to calculate the 15 bit sample. A "new" Vin from a source external to ADC 100 to be sampled is used for the first rotation.

In the case where ADC 100 is used in a pipeline ADC, each stage of the pipeline is responsible for generating 1 bit of the N bit sample to be computed. Accordingly, in the case of a 15 bit sample, the ADC will include 15 pipelined stages. The signal used as Vin for the first stage is obtained from a source external to the ADC to be sampled. The signal at nodes C and D is provided to stages 2-15 for processing.

Table 1 below illustrates the voltages that are provided as input to a next stage, whether in a pipelined or algorithmic ADC, for performing a next rotation. As shown, the voltage that is used for a next rotation is determined according to the particular voltage range in which the signal from the prior rotation is classified.

TABLE 1

| Voltage Range | Vin + i |
| --- | --- |
| Top | 2Vin − Vref |
| Topcal | 2Vin − Ri * Vref |
| Mid | 2Vin |

TABLE 1-continued

| Voltage Range | Vin + i |
|---|---|
| Botcal | 2Vin + Ri * Vref |
| Bot | 2Vin + Vref |

From Table 1, when the signal at nodes C and D is classified into the top voltage range, Vin to the next rotation (Vin+i) is 2Vin−Vref. When the signal at nodes C and D is classified into the topcal voltage range, Vin+i is 2Vin−Ri*Vref. The variable Ri is the value of random signal 178 at the time that Vin is obtained for the current rotation. As noted, since random signal 178 is either a one or a zero, the value that is used as the voltage for the next rotation is either 2Vin (when Ri=0) or 2Vin−Ri*Vref (when Ri=1). Accordingly, when a signal from nodes C and D is determined to be in the topcal range, the value used for the next rotation depends upon the state of random signal 178. When the signal at nodes C and D is classified into the mid voltage range, Vin+i is 2Vin. When the signal at nodes C and D is classified into the botcal voltage range, Vin+i is 2Vin+Ri*Vref. When the signal at nodes C and D is classified into the bot voltage range, Vin+i is 2Vin+Vref.

Table 2 below illustrates the voltages that are provided as input (Vin+i) to the circuitry responsible for performing next rotations (e.g., rotations other than the first) in which Ri=0 and Ri=1.

TABLE 2

| | Vin + i | |
|---|---|---|
| Voltage Range | Ri = 0 | Ri = 1 |
| Top | 2Vin − Vref | 2Vin − Vref |
| Topcal | 2Vin | 2Vin − Vref |
| Mid | 2Vin | 2Vin |
| Botcal | 2Vin | 2Vin + Vref |
| Bot | 2Vi + Vref | 2Vin + Vref |

When the signal at nodes C and D is classified into the top voltage range, the signal provided in the next rotation is 2Vin−Vref. When the signal at nodes C and D is classified into the topcal voltage range, the signal provided to the next rotation is 2Vin−Ri*Vref, where the variable Ri is the value of random signal 178 at the time that Vin is obtained for the current rotation. When the signal at nodes C and D is classified into the mid voltage range, the signal provided to the next rotation is 2Vin. When the signal at nodes C and D is classified into the botcal voltage range, the signal provided to the next rotation is 2Vin+Ri*Vref. Again, the variable Ri is the value of random signal 178 at the time that Vin is obtained for the current rotation. When the signal at nodes C and D is classified into the bot voltage range, the signal provided to the next rotation is 2Vi+Vref.

As shown, decoder 164 includes a gain calculator 166 and a plurality of averaging blocks 168, 170, 172, and 174. Each averaging block 168-174 can include a memory element and circuitry that is configured to calculate an average or mean of received sample values. Averaging block 168 is configured to receive samples, i.e., the samples from ADC output 180, and compute an average of the samples in which the voltage at nodes C and D during the first rotation for the sample was determined to fall within the topcal voltage range and for which the state of random signal 178 was zero (denoted as "mean_topcal_0"). Averaging block 170 is configured to receive samples from ADC output 180 and compute an average of the samples in which the voltage at nodes C and D during the first rotation for the sample was determined to fall within the topcal voltage range and for which the state of random signal 178 was one (denoted as "mean_topcal_1").

Averaging block 172 is configured to receive samples from ADC output 180 and compute an average of the samples in which the voltage at nodes C and D during the first rotation for the sample was determined to fall within the botcal voltage range and for which the state of random signal 178 was zero (denoted as "mean_botcal_0"). Averaging block 174 is configured to receive samples from ADC output 180 and compute an average of the samples in which the voltage at nodes C and D during the first rotation for the sample was determined to fall within the botcal voltage range and for which the state of random signal 178 was one (referred to as "mean_botcal_1).

Gain calculator 166 is configured to calculate a gain value for analog input stage 102 using the averages calculated by, and stored within, averaging blocks 168, 170, 172, and/or 174. Gain calculator 166 calculates a delta between the various averages calculated using averaging blocks 168, 170, 172, and 174. For example, gain calculator 166 calculates the following quantities:

delta_topcal=mean_topcal_0−mean_topcal_1
delta_botcal=mean_botcal_0−mean_botcal_1

Gain calculator 166 determines the gain of analog input stage 102 during a $k^{th}$ rotation of an N bit ADC (e.g., an ADC as described with reference to FIG. 1) using expression 1 below.

$$\text{Gain} = 2^{N-1-k} - \frac{\frac{(\text{delta\_botcal} + \text{delta\_topcal})}{2}}{2^{N-2-k}} \qquad (1)$$

Simplifying expression 1 above, gain calculator 166 determines the gain of analog input stage 102 during the first rotation of an N bit ADC using expression 2 below.

$$\text{Gain} = 2^{N-2} - \frac{\frac{(\text{delta\_botcal} + \text{delta\_topcal})}{2}}{2^{N-3}} \qquad (2)$$

In general, control signals 176 set the state of switches 110-114 and 128-132 within reference blocks 109 and 127, respectively, to generate the value of Vin+1 specified in Tables 1 and 2 for a next rotation depending upon the state of random signal 178 and the particular range within which the signal at nodes C and D is classified. When a signal is classified in bot, switches 114 and 128 are closed for the next rotation (with switches 110, 112, 130, and 132 being closed). When a signal is classified in mid, switches 112 and 130 are closed for the next rotation (with switches 110, 114, 128, and 132 being open). When a signal is classified in top, switches 110 and 132 are closed for the next rotation (with switches 112, 114, 128, and 130 being open).

Figure 2:
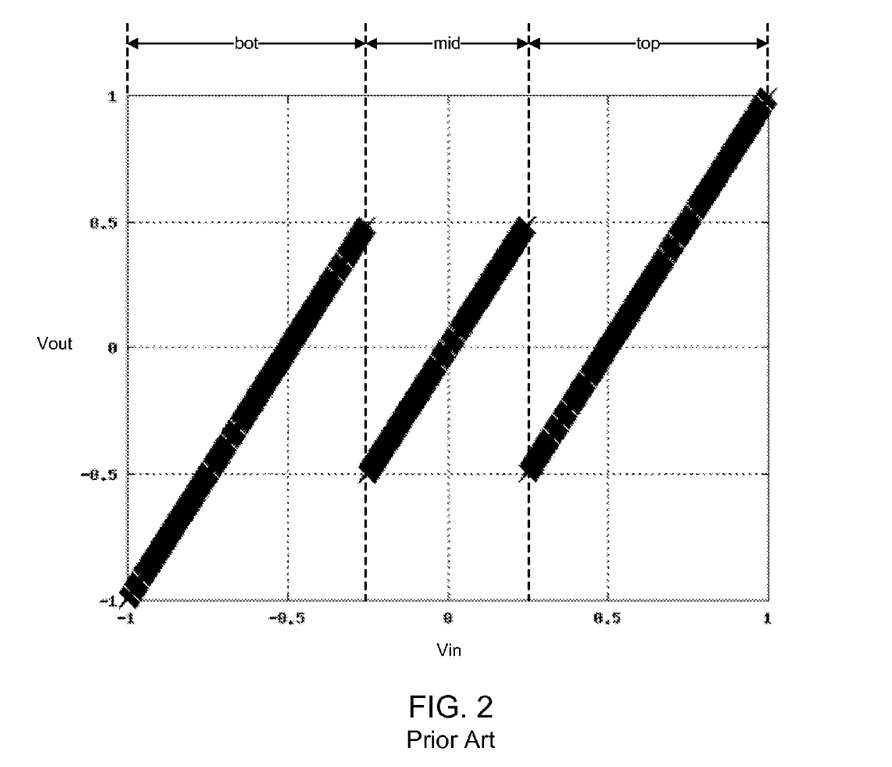
FIG. 2 is a graph illustrating a transfer plot for a stage of an ADC in which background calibration is not used.

FIG. 2 is a graph illustrating a transfer plot for a stage of an ADC in which background calibration is not used. As shown, for each Vin received, the stage of the ADC generates a unique value for Vout that is provided as Vin to the next stage. As shown, the transfer plot of FIG. 2 includes only a top range, a mid range, and a bot range.

Figure 3:
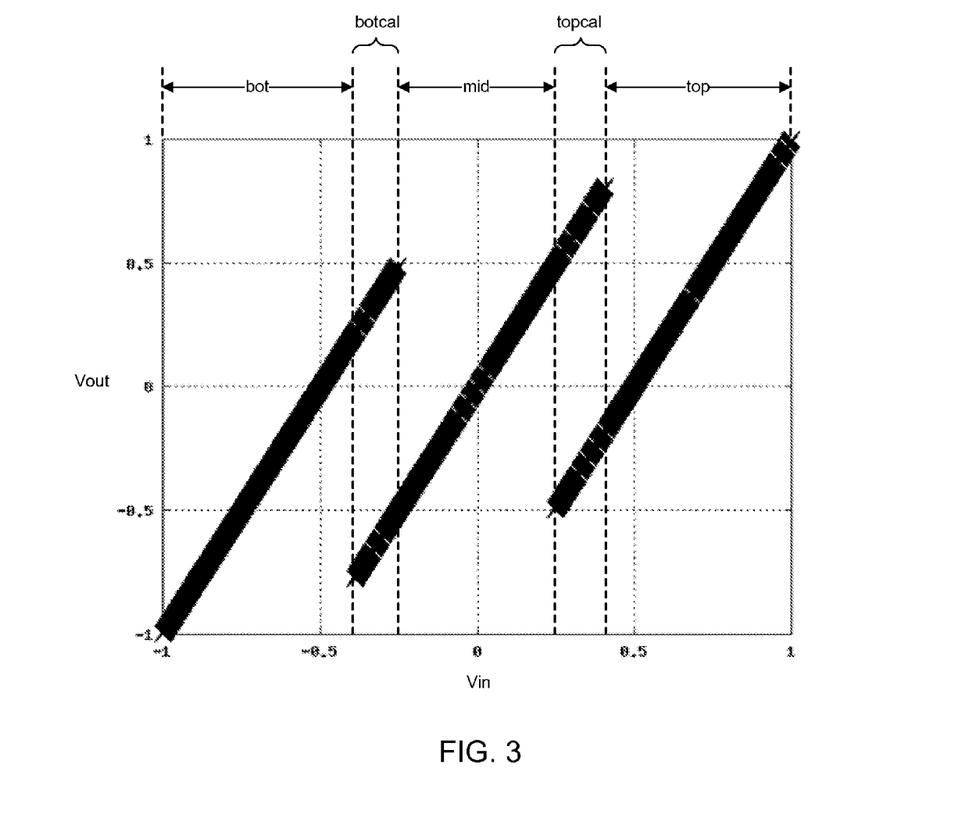
FIG. 3 is a graph illustrating a transfer plot for a stage of an ADC in which background calibration is used.

FIG. 3 is a graph illustrating a transfer plot for a stage of an ADC in which background calibration is used. As shown, the transfer plot of FIG. 3 includes the top, topcal, mid, and bot ranges. For each Vin received, the stage of the ADC generates a unique value for Vout that is provided as Vin to the next stage only in the top, mid, and bot ranges. When in either topcal or botcal, two possible values for Vout can be generated for Vin depending upon the state of random signal 178. As discussed, a signal classified in topcal for a first rotation results in a Vout that is provided to the second rotation in accordance with either the top or mid range depending upon the state of random signal 178 as illustrated in Tables 1 and 2. A signal classified in botcal for a first rotation results in a Vout that is provided to the second rotation in accordance with either the mid or bot range depending upon the state of random signal 178 as illustrated in Tables 1 and 2.

The different values used as Vout for the second rotation propagate through each additional rotation in determining a resulting N bit sample. Because decoder 164 is aware of the different processing that is applied, decoder 164 can remove the voltage offset introduced into the process as a result of using the topcal and botcal ranges during decoding. Further, the decoder is aware of the state of random signal 178, e.g., whether topcal was treated as top or mid and whether botcal was treated as mid or bot. Thus, decoder 164 is able to generate sample values in which the voltage offset introduced is removed.

Still, the resulting samples that are generated are stored as described when the first rotation was determined to be within either topcal or botcal along with the state of random signal 178, thereby allowing averaging blocks 168-174 to perform the averaging described and allowing gain calculator 166 to calculate the actual gain of analog input stage 102.

Figure 4:
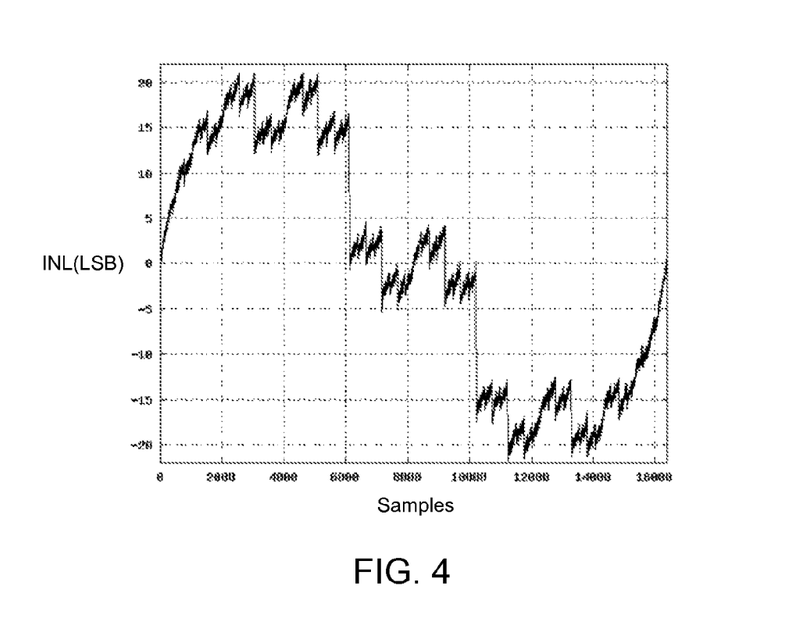
FIG. 4 is a graph illustrating a plot of integral nonlinearity (INL) for an ADC in which background calibration is not used.

FIG. 4 is a graph illustrating a plot of integral nonlinearity (INL) for an ADC in which background calibration is not used. The ADC modeled to generate the plot of FIG. 4 is a 14 bit ADC. As shown, the INL, as measured in LSB, illustrates an INL ranging from approximately 20 to −20 over $2^{20}$ conversions (samples).

Figure 5:
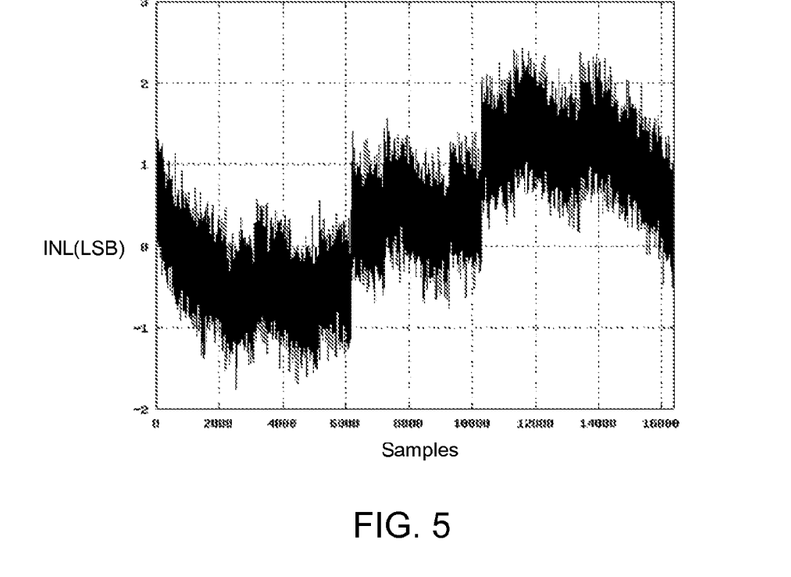
FIG. 5 is a graph illustrating a plot of INL for an ADC in which background calibration is used.

FIG. 5 is a graph illustrating a plot of INL for an ADC in which background calibration is used. The ADC modeled to generate the plot of FIG. 5 is the same as that used to generate the plot in FIG. 4, albeit with background calibration turned on. The background calibration of the variety described with reference to FIG. 1 using additional converters was used and active when generating the plot of FIG. 5. As shown, the range of INL as measured over $2^{20}$ conversions (samples) is reduced to approximately 2 to −1.7.

Figure 6:
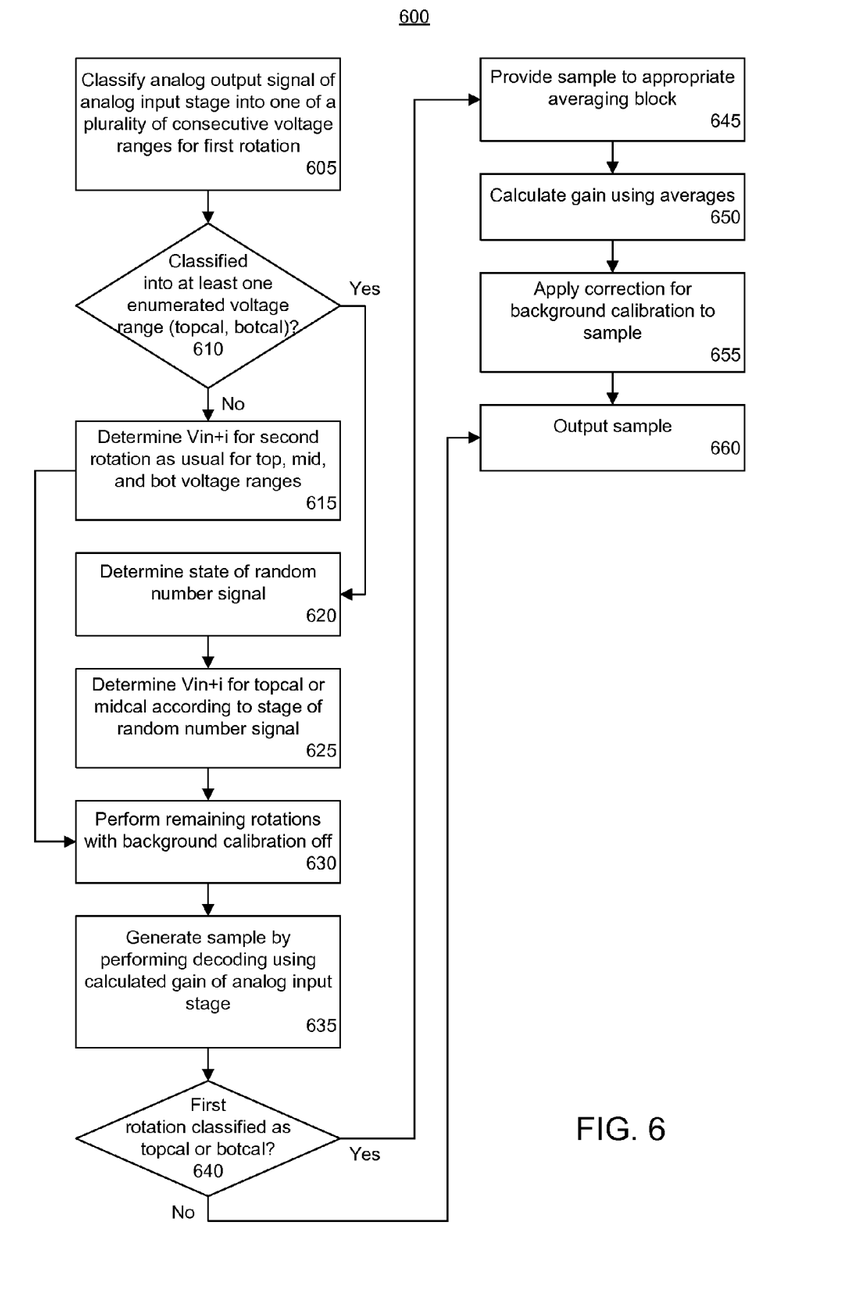
FIG. 6 is a flow chart illustrating a method of background calibration.

FIG. 6 is a flow chart illustrating a method 600 of background calibration. Method 600 can be performed by an ADC as described with reference to FIG. 1 to generate N bits. The ADC includes and analog input stage and a digital stage as described.

In block 605, the analog output signal of the analog stage of the ADC is classified into one of a plurality of consecutive voltage ranges, e.g., top, topcal, mid, botcal, or bot. The classification is performed for a first rotation in the process of generating a sample to be output by the ADC. In block 610, the ADC determines whether the analog output signal is classified into one or more enumerated voltage ranges. For example, the ADC determines whether the analog output signal is classified within topcal or botcal.

If so, method 600 proceeds to block 620. If not, method 600 continues to block 615. In block 615, the value of Vin+i is determined. When in block 615, the analog output signal has been classified as being within top, mid, or bot. Accordingly, the value of Vin+i to be used for the second rotation is not dependent upon the state of the random number signal and is determined in accordance with Table 1. The top, mid, and bot voltage ranges are non-enumerated voltage ranges as none of the ranges is dependent upon the state of the random number signal. Accordingly, the switches in reference blocks 109 and 127 are set using controls signals (e.g., control signals 176) as is the case in a conventional implementation to result in Vin+1 in accordance with Table 1.

After block 615, method 600 continues to block 630. In block 630, any remaining rotations are performed. The remaining rotations are performed with background calibration turned off. As such, all remaining rotations performed to generate a sample are performed using only the top, mid, and bot voltage ranges.

Continuing with block 620, the analog output signal has been classified into one of the enumerated ranges of topcal or botcal. As such, the processing of the analog output signal is dependent upon the state of the random number signal. Accordingly, in block 620, the state of the random number signal is determined. For example, the decoder takes note of the current state of the random number signal as being zero or one.

In block 625, the value of Vin+i to be used for the second rotation is dependent upon the state of the random number signal. The value of Vin+i is determined according to Tables 1 and 2 given the state of the random number signal. In general, the value of Vin+i is determined as if the analog output signal had been classified into a different, non-enumerated voltage range. The particular non-enumerated voltage range used is determined according to the state of the random number signal.

For example, a non-enumerated voltage range that is either above or below the enumerated voltage range is selected according to the state of the random number signal. In the case of the enumerated voltage range being topcal, Vin+i is determined as if the analog output signal was determined to be in either the top voltage range (above topcal) or the mid voltage range (below topcal) according to the state of the random number signal as specified within Tables 1 and 2. In the case of the enumerated voltage range being botcal, Vin+i is determined as if the analog output signal was determined to be in either the mid voltage range (above botcal) or the bot voltage range (below botcal) according to the state of the random number signal as specified within Tables 1 and 2.

Accordingly, the switches in reference blocks 109 and 127 are set using control signals (e.g., control signals 176) to determine Vin+1 in accordance with Table 1 using the determined value of Ri. Thus, if a signal is classified as botcal and Ri=0, the switches are set for the next rotation as if the signal was classified as mid. If a signal is classified as botcal and Ri=1, the switches are set for the next rotation as if the signal was classified as bot (and thus are in a different state than in mid and providing a different reference voltage to nodes A and B). Similarly, if the signal is classified as topcal and Ri=1, the switches are set for a next rotation as if the signal was classified as top. If the signal is classified as topcal and Ri=0, the switches are set for a next rotation as if the signal was classified as mid (and thus in a different state than in top providing a different reference voltage to nodes A and B).

After block 625, method 600 continues to block 630, where any remaining rotations are performed with background calibration being turned off. For example, in the case where the analog output signal of the first rotation is not within an enumerated voltage range, the remaining rotations (e.g., N−1 rotations of N rotations performed for an N bit sample to be generated) are performed as normal without background calibration. In that case, the resulting sample that is generated is determined in a conventional manner that involves only the top, mid, and bot voltage ranges.

In the case where the analog output signal of the first rotation was within an enumerated voltage range, the remaining rotations still are performed as normal without background calibration. The adjustment to Vin+i, however, as provided to the second rotation does induce a change that propagates through the decoding process for the remaining rotations. The change introduced during the first rotation for the background calibration process alters the resulting sample, but is corrected in the decoding process before being output from the ADC as described herein.

In block 635, the decoder, generates a sample using the rotations that were performed. In generating the sample, the actual gain of the analog input stage is used in the decoding. In block 640, the decoder determines whether the first rotation was classified as being located within either topcal or botcal (an enumerated voltage range). If so, method 600 continues to block 645. If not, method 600 proceeds to block 660. In block 660, the decoder outputs the sample from the ADC since no correction for the background calibration process is required.

Continuing with block 645, the decoder has determined that the analog output signal of the analog input stage of the ADC was classified as being located within either topcal or botcal during the first rotation. In block 645, the decoder provides the sample to the appropriate averaging block as described. In block 650, the gain calculator within the decoder calculates (e.g., updates) the gain of the analog input stage of the ADC using the averaged samples. In block 655, the decoder applies a correction for the background calibration processing. For example, the decoder corrects the sample so that the value specified by the sample is the same as if background processing were not performed during any of the rotations for the sample. After block 655, the sample (in corrected form) is output from the ADC.

For purposes of explanation, specific nomenclature is set forth to provide a thorough understanding of the various inventive concepts disclosed herein. The terminology used herein, however, is for the purpose of describing particular embodiments only and is not intended to be limiting. For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. An analog-to-digital converter (ADC), comprising:
   an analog input stage comprising an output configured to generate an analog output signal; and
   a digital stage coupled to the output of the analog input stage and configured to classify the analog output signal into one of a plurality of consecutive voltage ranges;
   wherein responsive to the analog output signal being classified within a first enumerated range of the plurality of voltage ranges during a rotation of a sample, determining a voltage for a subsequent rotation of the sample as if the analog output signal is classified into a non-enumerated voltage range selected according to a state of a random number signal; and
   wherein the digital stage is further configured to:
   determine a first average of samples in which the analog output signal is classified in the first enumerated voltage range for a rotation and a voltage for a subsequent rotation is determined as if the analog input signal is classified into the voltage range immediately above the first enumerated range for the rotation; and
   determine a second average of samples in which the analog output signal is classified in the first enumerated voltage range for a rotation and a voltage for a subsequent rotation is determined as if the analog signal is classified in the voltage range immediately below the first enumerated voltage range.

2. The ADC of claim 1, wherein responsive to the analog output signal being classified within a second enumerated voltage range of the plurality of voltage ranges for a rotation in a subsequent sample, determining a voltage for a subsequent rotation of the subsequent sample as if the analog output signal is classified into a non-enumerated voltage range according to a state of the random signal.

3. The ADC of claim 2, wherein the digital stage is further configured to:
    determine a third average of samples in which the analog output signal is classified in the second enumerated voltage range and a voltage for the subsequent rotation is determined as if classified in the voltage range immediately above the second enumerated voltage range; and
    determine a fourth average of samples in which the analog output signal is classified in the second enumerated voltage range and a voltage for the subsequent rotation is determined as if classified in the voltage range immediately below the second enumerated voltage range.

4. The ADC of claim 1, wherein the digital stage is further configured to calculate a gain of the analog input stage according to the first average and the second average.

5. The ADC of claim 3, wherein the digital stage is further configured to calculate a gain of the analog input stage according to the first average, the second average, the third average, and the fourth average.

6. The ADC of claim 4, wherein the digital stage is further configured to generate samples using the calculated gain of the analog input stage and correct samples generated in which the analog output signal is classified during a rotation in an enumerated voltage range.

7. The ADC of claim 1, wherein the digital stage comprises:
    a comparator stage comprising four comparators; and
    a digital block coupled to an output of each comparator and configured to indicate which voltage range the analog output signal is classified according to a signal output from each comparator.

8. An analog-to-digital converter (ADC), comprising:
    an analog input stage comprising an output configured to generate an analog output signal; and
    a digital stage coupled to the output of the analog input stage, wherein the digital stage comprises:
        a comparator stage comprising at least four comparators configured to receive the analog output signal;
        a random number generator configured to generate a random number signal;
        a digital block configured to receive an output from each comparator and generate a classification assigning the analog output signal into one of a plurality of consecutive voltage ranges; and
        a decoder coupled to the digital block and random number generator and configured to receive the classification and the random number signal;
    wherein responsive to the analog output signal being classified within a first enumerated voltage range of the plurality of voltage ranges during a rotation of a sample, the decoder is configured determine a voltage provided to a subsequent rotation as if the analog output signal is classified into a non-enumerated voltage range selected according to a state of the random number signal; and
    wherein the decoder further comprises:
        a first mean calculation block configured to determine a first average of samples in which the analog output signal is classified in the first enumerated voltage range and a voltage for a subsequent rotation is determined as if the analog output signal is classified in the voltage range immediately above the first enumerated voltage range; and
        a second mean calculation block configured to determine a second average of samples in which the analog output signal is classified in the first enumerated voltage range and a voltage for a subsequent rotation is determined as if the analog output signal is classified in the voltage range immediately below the first enumerated voltage range.

9. The ADC of claim 8, wherein responsive to the analog output signal being classified within a second enumerated voltage range of the plurality of voltage ranges for a rotation for a subsequent sample, the decoder is configured to determine a voltage for a subsequent rotation of the subsequent sample as if the analog output signal is classified into a non-enumerated voltage range according to a state of the random number signal.

10. The ADC of claim 9, wherein the decoder further comprises:
    a third mean calculation block configured to determine a third average of samples in which the analog output signal is classified in the second enumerated voltage range and determine a voltage provided to a subsequent rotation as if the analog output signal is classified into the voltage range immediately above the second enumerated voltage range; and
    a fourth mean calculation block configured to determine a fourth average of samples in which the analog output signal is classified in the second enumerated voltage range and determine a voltage provided to a subsequent rotation as if the analog output signal is classified in the voltage range immediately below the second enumerated voltage range.

11. The ADC of claim 8, wherein the decoder comprises:
    a gain calculator coupled to at least the first mean calculation block and the second mean calculation block and configured to calculate a gain of the analog input stage according to the first average and the second average.

12. The ADC of claim 10, wherein the decoder comprises:
    a gain calculator coupled to the first mean calculation block, the second mean calculation block, the third mean calculation block, and the fourth mean calculation block and configured to calculate a gain of the analog input stage according to the first average, the second average, the third average, and the fourth average.

13. The ADC of claim 11, wherein the decoder is further configured to generate samples using the calculated gain of the analog input stage and correct samples generated in which the analog output signal was classified during a rotation into an enumerated voltage range.

14. A method of calibrating an analog-to-digital converter (ADC), the method comprising:
    classifying an analog output signal of an analog input stage of the ADC into one of a plurality of consecutive voltage ranges;
    responsive to the analog output signal being classified within a first enumerated range of the plurality of voltage ranges during a rotation of a sample, determining a voltage for a subsequent rotation as if the analog output signal is classified into a non-enumerated voltage range selected according to a state of a random number signal;
    generating samples; and
    calculating a gain of the analog input stage according to a first average of samples in which the analog output signal is classified in the first enumerated voltage range and the random number signal is in a first state for a rotation and a second average of samples in which the analog output signal is classified in the first enumerated range and the random number signal is in a second state for a rotation.

15. The method of claim 14, wherein calculating a gain of the analog input stage further comprises:

for each sample of the first average of samples, determining the voltage as if the analog output signal is classified in the voltage range immediately above the first enumerated voltage range; and for each sample of the second average of samples, determining the voltage as if the analog output signal is classified in the voltage range immediately below the first enumerated range.

16. The method of claim 15, further comprising:

responsive to the analog output signal being classified within a second enumerated range of the plurality of voltage ranges during a rotation of a subsequent sample, determining a voltage for a subsequent rotation of the subsequent sample as if the analog output signal is classified into a second enumerated voltage range selected according to the state of the random number signal;

wherein the gain of the analog input stage is further calculated according to a third average of samples in which the analog output signal is classified in the second enumerated voltage range and the random number signal is in the first state and a fourth average of samples in which the analog output signal is classified in the second enumerated range and the random number signal is in the second state.

17. The method of claim 16, wherein calculating a gain of the analog input stage further comprises:

for each sample of the third average of samples, determining the voltage as if the analog output signal is classified in the voltage range immediately above the second enumerated voltage range; and for each sample of the fourth average of samples, determining the voltage as if the analog output signal is classified in the voltage range immediately below the second enumerated range.

18. The method of claim 17, wherein generating samples comprises using the calculated gain of the analog input stage and correcting samples generated in which the analog output signal is classified during a rotation in an enumerated voltage range.

* * * * *